(12) United States Patent
Fang et al.

(10) Patent No.: US 7,558,065 B2
(45) Date of Patent: Jul. 7, 2009

(54) AIR GUIDE WITH HEAT PIPE AND HEAT SINK AND ELECTRONIC APPARATUS EQUIPPED WITH THE SAME

(75) Inventors: Chih-Liang Fang, Taipei County (TW); Yie-Tun Huang, Taipei County (TW)

(73) Assignee: Adlink Technology, Inc., Taipei (TW)

( * ) Notice: Subject to any disclaimer, the term of this patent is extended or adjusted under 35 U.S.C. 154(b) by 31 days.

(21) Appl. No.: 11/826,741

(22) Filed: Jul. 18, 2007

(65) Prior Publication Data
US 2009/0021914 A1 Jan. 22, 2009

(51) Int. Cl.
*H05K 7/20* (2006.01)
(52) U.S. Cl. ............ 361/700; 361/695; 361/704; 174/15.2; 257/715; 165/80.3; 165/80.4; 165/104.26
(58) Field of Classification Search ............ None
See application file for complete search history.

(56) References Cited

U.S. PATENT DOCUMENTS

| 6,408,934 | B1 * | 6/2002 | Ishida et al. ............ 165/80.3 |
| 6,914,780 | B1 * | 7/2005 | Shanker et al. ............ 361/687 |
| 6,967,841 | B1 * | 11/2005 | Chu et al. ............ 361/700 |
| 7,177,154 | B2 * | 2/2007 | Lee ............ 361/704 |
| 7,277,286 | B2 * | 10/2007 | Lee ............ 361/700 |
| 7,286,357 | B2 * | 10/2007 | Wung et al. ............ 361/700 |
| 7,394,653 | B2 * | 7/2008 | Cheng et al. ............ 361/687 |
| 2002/0053421 | A1 * | 5/2002 | Hisano et al. ............ 165/104.33 |
| 2006/0238980 | A1 * | 10/2006 | Bhattacharyya et al. ............ 361/700 |
| 2006/0279926 | A1 * | 12/2006 | Koo ............ 361/688 |

\* cited by examiner

*Primary Examiner*—Boris L Chervinsky
(74) *Attorney, Agent, or Firm*—Reed Smith LLP; Juan Carlos A. Marquez, Esq.

(57) ABSTRACT

The invention discloses an air guide with at least one heat sink and at least one heat pipe. The heat pipe of the air guide can conduct the heat generated by a heat source to the heat sink of the air guide. The heat sink of the air guide increases the area of heat dissipation, and the distribution of the heat sink enables more blown-in air to carry the heat away. Accordingly, the air guide of the invention can increase the efficiency of heat dissipation within an electronic device.

4 Claims, 3 Drawing Sheets

AIR GUIDE WITH HEAT PIPE AND HEAT SINK AND ELECTRONIC APPARATUS EQUIPPED WITH THE SAME

BACKGROUND OF THE INVENTION

1. Field of the Invention

The invention relates to an air guide and, more particularly, relates to an air guide covering a main board and for increasing the efficiency of heat dissipation within an electronic apparatus.

2. Description of the Prior Art

With the advance of technology, users hope that an electronic apparatus has as many functions as possible. Because the number of electronic components of an electronic apparatus continuously increases, the electronic apparatus becomes hotter and hotter. The heat generated by the electronic components not only increases the temperature of the electronic apparatus, but also affects the durability of the electronic components. Therefore, how to get rid of the heat from within the electronic apparatus is getting more and more important.

In prior arts, how to reduce the temperature of the electronic component comprises the following methods of: (1) disposing a heat sink on the electronic component to dissipate heat; (2) disposing a fan to blow air into the electronic apparatus to cool the heat generated by the electronic component; and (3) lowering the power consumed by the electronic component to reduce heat generation. In order to increase the efficiency of heat dissipation, the surface area of the heat sink needs to be increased, for example, fins of the heat sink are thinner and the number of fins has to be increased as well. The heat sink needs to be made of a material with a higher thermal conductivity (e.g. copper). Additionally, the rotation speed of the fan needs to be increased or the fan needs to be enlarged to increase airflows. Furthermore, the power consumed by each of the electronic component can be reduced by advanced manufacturing process.

Although most electronic apparatuses have a fan disposed on an air inlet or an air outlet, the fan only blows air into the electronic apparatus or sucks air out of the electronic apparatus. Because most electronic apparatuses do not have a special airflow design, that leads to turbulent flows and a lower exchange efficiency of air. Therefore, the efficiency of heat dissipation with the electronic component is indirectly lowered. In order to efficiently cool the heat generated by the electronic apparatus, an air guide is provided in prior art. The air guide covers the electronic components of the electronic apparatus, and is used for guiding air to the heat sinks disposed on the electronic components. However, the air resistances of the heat sinks are high, so most of the blown-in air does not flow through the heat sinks disposed on the electronic components. The efficiency of heat dissipation within the electronic apparatus is therefore lowered.

Accordingly, the invention provides an air guide with at least one heat pipe and at least one heat sink to solve the aforesaid problems.

SUMMARY OF THE INVENTION

The main scope of the invention is to provide an air guide, and at least one heat sink and at least one heat pipe are disposed on a surface of the air guide, and are disposed in a space between the air guide and a main board. The heat generated by a heat source is guided by the heat pipe to the heat sinks of the air guide. The distribution of the heat sinks of the air guide can enable more blown-in air to flow through heat sinks, so the air guide of the invention can increase the efficiency of heat dissipation within the electronic apparatus.

According to a preferred embodiment, the air guide of the invention covers a main board. The main board has a heat source, and the heat source can be a central processing unit (CPU) or another electronic component. The air guide comprises a cover, at least one heat sink, and at least one heat pipe. The cover has a surface. The heat sink is disposed on the surface of the cover and is as distant as possible from the heat source. The heat pipe is disposed on the surface of the cover, and each of the heat pipes has a first end and a second end. The first end of the heat pipe is close to the heat source, and the second end is close to one of the heat sinks, such that the heat generated by the heat source can be guided by the heat pipe to the heat sink. Accordingly, the air guide of the invention can increase the efficiency of heat dissipation within the electronic apparatus.

According to another preferred embodiment, the electronic apparatus of the invention comprises a main board, an air guide, a second heat sink, and a fan. The main board has a heat source which can be a CPU or another electronic component. The second heat sink is disposed on the heat source and is used for dissipating heat generated by the heat source. The air guide cooperates with the main board to form an air inlet, and the fan blows air into the air inlet to cool the heat generated by the heat source. The air guide covers on the main board, and the air guide comprises a cover, at least one first heat sink, and at least one heat pipe. The first heat sink is disposed on the surface of the cover and is as distant as possible from the heat source. The heat pipe is disposed on the surface of the cover, and each of the heat pipes has a first end and a second end. The first end is close to the heat source, and the second end is close to one of the first heat sinks to guide heat generated by the heat source to the first heat sink. Accordingly, the invention improves the traditional air guide. It not only guides an airflow direction, but also increases the area of heat dissipation. The distribution of heat sinks of the air guide enables more air to flow over the heat sinks, and increases the efficiency of heat dissipation.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
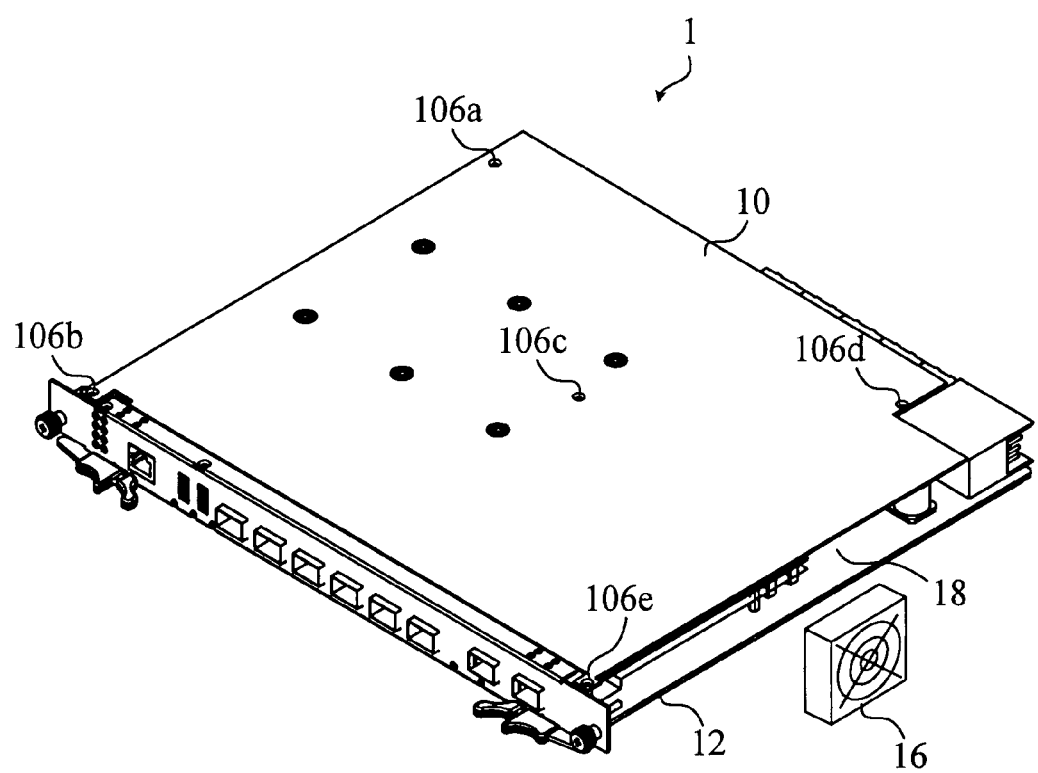
FIG. 1 is a schematic diagram illustrating an electronic apparatus according to a preferred embodiment of the invention.
Figure 2:
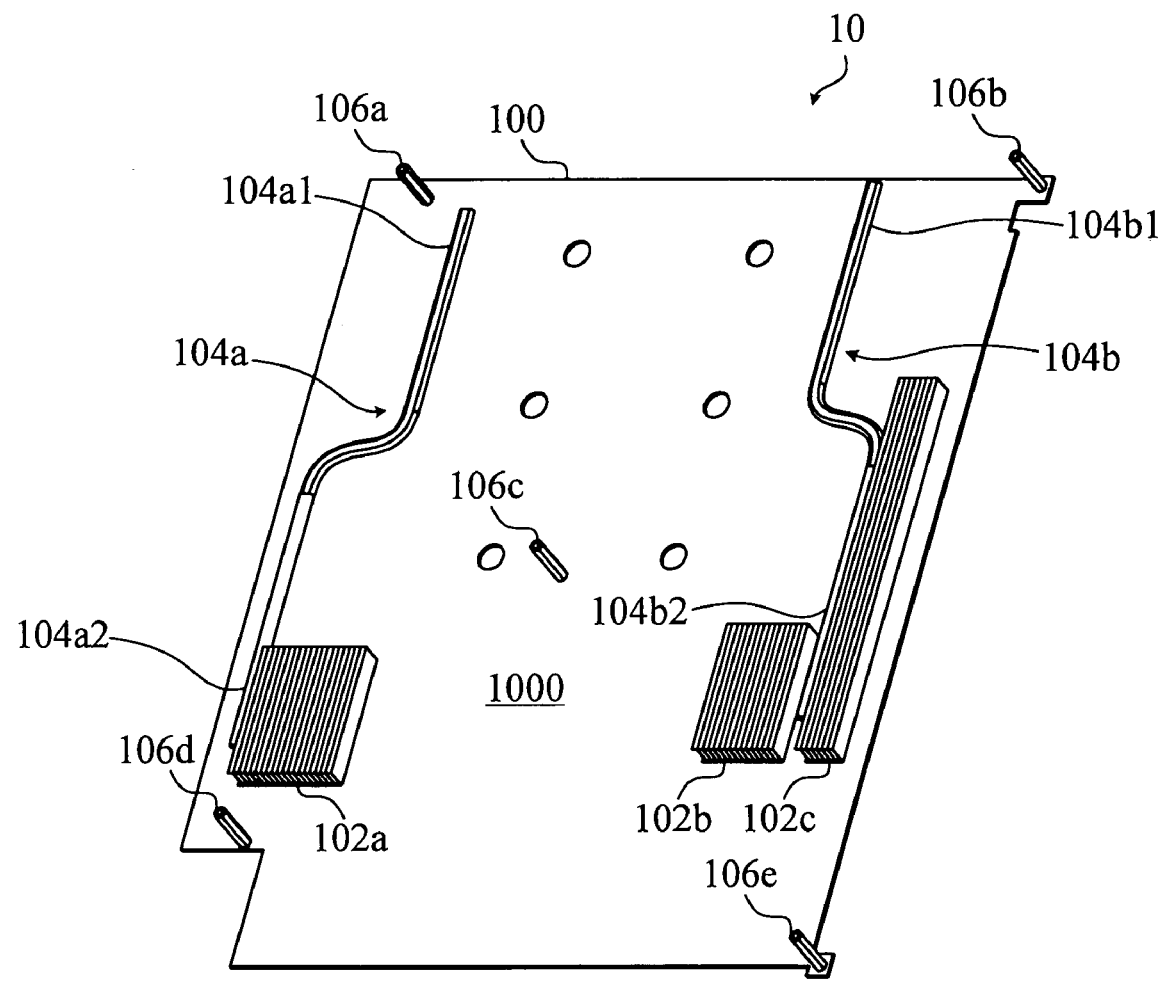
FIG. 2 is a schematic diagram illustrating an air guide in FIG. 1.
Figure 3:
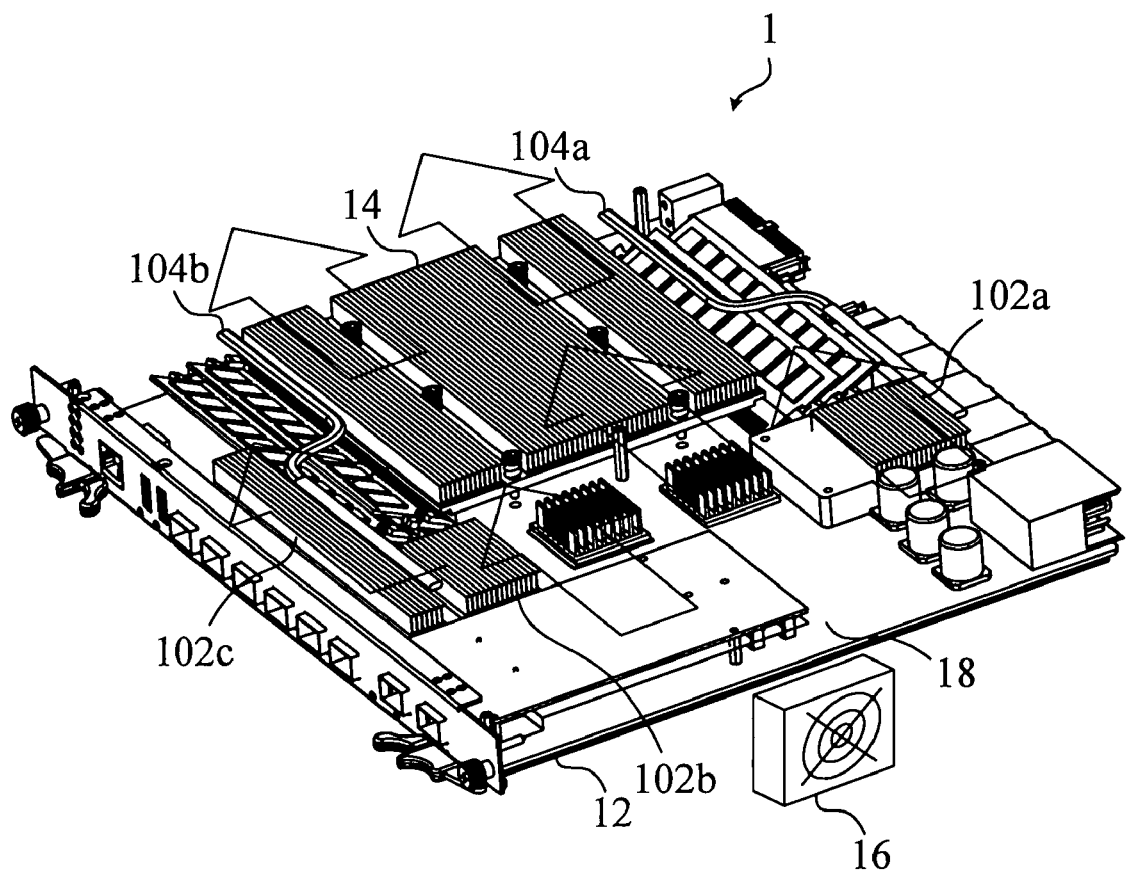
FIG. 3 is a schematic diagram illustrating the electronic apparatus in FIG. 1 with the cover of the air guide removed.

Please refer to FIG. 1 through FIG. 3. FIG. 1 is a schematic diagram illustrating an electronic apparatus 1 according to a preferred embodiment of the invention. FIG. 2 is a schematic diagram illustrating an air guide 10 in the FIG. 1. FIG. 3 is a schematic diagram illustrating the electronic apparatus 1 in FIG. 1 with a cover 100 of the air guide 10 removed.

As shown in FIG. 1 and FIG. 3, the electronic apparatus 1 comprises an air guide 10, a main board 12, a heat sink 14 and a fan 16. The main board 12 has a heat source (not shown), and the heat sink 14 is disposed on the heat source to dissipate heat generated by the heat source. In the embodiment, the heat source can be a central processing unit (CPU) or another electronic component. When the air guide 10 covers the main board 12, the air guide 10 cooperates with the main board 12 to form an air inlet 18. The fan 16 can blow air into the air inlet 18 to cool the heat generated by the heat source.

As shown in FIG. 2, the air guide 10 comprises a cover 100, heat sinks 102a~102c, and heat pipes 104a and 104b. The heat sinks 102a~102c are disposed on the surface 1000 of the cover 100, and are as distant as possible from the heat source (where the heat sink 14 in FIG. 3 is disposed). The heat pipes 104a and 104b are disposed on the surface 1000 of the cover 100. The heat pipe 104a has a first end 104a1 and a second end 104a2, wherein the first end 104a1 is close to the heat source (where the heat sink 14 in FIG. 3 is disposed), and the second end 104a2 is close to the heat sink 102a. The heat pipe 104b has a first end 104b1 and the second end 104b2, wherein the first end 104b1 is close to the heat source (where the heat sink 14 in FIG. 3 is disposed), and the second end 104b2 is close to the heat sinks 102b and 102c. Accordingly, the heat pipes 104a and 104b can respectively guide heat from the heat sink 14 shown in FIG. 3 to the heat sinks 102a~102c, so the heat source will not accumulate heat. The heat sinks 102a~102c of the air guide can also enlarge the area of heat dissipation of the heat sink 14 shown in FIG. 3. Additionally, the air guide 10 has a cover 100 covering the main board 12, and is used for guiding air to flow through the heat sinks 14, and 102a~102c, so as to cool the temperature of the electronic apparatus 1.

It should be noted that the number of the heat sinks and the heat pipes of the air guide 10 can be adjusted according to a practical application.

As shown in FIG. 3, the heat sinks 102a~102c are close to both sides of the air inlet 18, and the heat sink 14 is distant from the air inlet 18. When the fan 16 blows air into the air inlet 18, the air will flow through the heat sinks 14 and 102a~102c, and will carry heat away.

As shown in FIG. 1 and FIG. 2, the air guide 10 further comprises pillars 106a~106e disposed on the surface 1000 of the cover 100. The air guide 10 can be fixed on the main board 12 by the pillars 106a~106e, but it can also be fixed by screws, bolts, or the like members.

Compared to prior art, the air guide of the invention has at least one heat sink and at least one heat pipe. The heat pipe can guide heat generated by the heat source to the heat sinks of the air guide. The heat sinks of the air guide increase the area of heat dissipation, and the distribution of the heat sinks enables more blown-in air to carry the heat away.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An electronic apparatus, comprising:
   a main board comprising a heat source; and
   an air guide covering the main board, wherein the air guide comprises:
   a cover with a surface;
   at least one first heat sink, disposed on the surface of the cover, being as distant from the heat source as possible;
   at least one heat pipe, disposed on the surface of the cover, each of the at least one heat pipe with a first end and a second end, the first end being close to the heat source, the second end being close to one of the at least one first heat sink, thereby the at least one heat pipe guides the heat generated by the heat source to the at least one first heat sink; and
   a second heat sink being disposed on the heat source to dissipate the heat generated by the heat source.

2. The electronic apparatus of claim 1, wherein the air guide further comprises a plurality of pillars disposed on the cover of the surface, and the air guide is fixed on the main board by the pillars.

3. The electronic apparatus of claim 1, wherein the heat source is a central processing unit (CPU).

4. The electronic apparatus of claim 1, further comprising a fan, wherein the air guide cooperates with the main board to form an air inlet, and the fan blows air into the air inlet to cool the heat generated by the heat source.

* * * * *